(12) United States Patent
Green

(10) Patent No.: US 6,225,928 B1
(45) Date of Patent: May 1, 2001

(54) COMPLEX BANDPASS MODULATOR AND METHOD FOR ANALOG-TO-DIGITAL CONVERTERS

(75) Inventor: Brian D. Green, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 09/265,758

(22) Filed: Mar. 10, 1999

(51) Int. Cl.$^7$ .................................................. H03M 3/00
(52) U.S. Cl. ............................................ 341/143; 341/155
(58) Field of Search ..................................... 341/143, 144, 341/155; 375/345, 176; 708/319; 333/176

(56) References Cited

U.S. PATENT DOCUMENTS

| | | | |
|---|---|---|---|
| 4,101,853 | * 7/1978 | Kosugi .................................. | 333/176 |
| 5,134,631 | * 7/1992 | Kingston et al. ..................... | 375/345 |
| 5,283,578 | 2/1994 | Ribner et al. ........................ | 341/143 |
| 5,381,357 | * 1/1995 | Wedgwood et al. ................. | 708/319 |
| 5,442,353 | 8/1995 | Jackson ................................ | 341/143 |
| 5,764,171 | 6/1998 | Stikvoort ............................. | 341/143 |

OTHER PUBLICATIONS

Singor et al., *Switched–Capacitor Bandpass Delta–Sigma A/D Modulation at 10.7 MHz*, iEEE Journal of Solid–State Circuits, vol. 30, No. 3 (Mar. 1995).

Jantzi et al., *Quadrature Bandpass ΔΣ Modulation for Digital Radio* iEEE Journal of Solid–State Circuits, vol. 32, No. 12 (Dec. 1997).

Ong et al., *A Two–Path Bandpass ΣΔ Modulator for Digital IF Extraction at 20 MHz*, iEEE Journal of Solid–State Circuits, vol. 32, no. 12 (Dec. 1997).

\* cited by examiner

*Primary Examiner*—Howard L. Williams
*Assistant Examiner*—Jean Bruner Jeanglaude
(74) *Attorney, Agent, or Firm*—Brian W. Peterman; Peter T. Rutkowski

(57) ABSTRACT

A discrete-time strongly cross-coupled complex bandpass modulator is disclosed that achieves the full potential of bandpass delta-sigma conversion by providing a strongly cross-coupled discrete-time complex loop filter structure with very low sensitivity to mismatches and by providing a simple scheme for correcting the effects of modulator mismatches. The complex bandpass modulator includes a plurality of non-linear resonators connected together and acting as a linear complex operator. Each resonator will act as a linear complex operator when an imaginary input signal is delayed by half a sample interval and an imaginary output signal is advanced by half a sample interval. In addition, degradation effects due to modulator mismatches are eliminated by digitally adjusting the relative gain of the real and imaginary paths following the output of the analog-to-digital converter and by adjusting the relative gain of the real and imaginary input signals.

45 Claims, 10 Drawing Sheets

COMPLEX BANDPASS MODULATOR AND METHOD FOR ANALOG-TO-DIGITAL CONVERTERS

This application is related to the following U.S. patent applications that have been filed concurrently herewith and that are hereby incorporated by reference in their entirety: Ser. No. 09/265,663, entitled "Method and Apparatus for Demodulation of Radio Data Signals" by Eric J. King and Brian D. Green.; Ser. No. 09/266,418, entitled "Station Scan Method and Apparatus for Radio Receivers" by James M. Nohrden and Brian P. Lum Shue Chan; Ser. No. 09/265,659, entitled "Method and Apparatus for Discriminating Multipath and Pulse Noise Distortions in Radio Receivers" by James M. Nohrden, Brian D. Green and Brian P. Lum Shue Chan; Ser. No. 09/265,752, entitled "Digital Stereo Recovery Circuitry and Method For Radio Receivers" by Brian D. Green; Provisional Ser. No. 60/123,634, entitled "Quadrature Sampling Architecture and Method For Analog-To-Digital Converters" by Brian P. Lum Shue Chan, Brian D. Green and Donald A. Kerth.

BACKGROUND OF THE INVENTION

1. Field of the Invention

The present invention relates generally to complex bandpass analog-to-digital converters. More specifically, the present invention relates to techniques for providing complex bandpass modulator implementations for delta-sigma analog-to-digital converters.

2. Description of the Related Art

Many devices utilize analog-to-digital converters (ADCs) to convert analog information to digital information so that signal processing may be accomplished on the digital side. In particular, delta-sigma ADCs are useful in providing digital information that may be further processed by digital signal processing. Such delta-sigma ADCs convert incoming signals in a particular frequency span of interest into a high rate (oversampled), low resolution (often one-bit) digital output stream. The ratio of the output data rate to the frequency span of interest is known as the oversampling ratio. The delta-sigma approach to analog-to-digital conversion, with relatively high oversampling ratio, is well known for its superior linearity and anti-aliasing performance compared to traditional conversion approaches with low oversampling ratios.

This superior performance has led to the development and widespread use of practical delta-sigma ADCs in applications where the frequency span of interest is centered near or at DC. Such applications are commonly known as "lowpass" or "baseband" converters. It has been recognized that the superior performance of delta-sigma conversion in principle is not confined to lowpass conversion, but should also be possible to achieve for applications in which the frequency span of interest is centered around a frequency distant from DC. Such applications are known as "bandpass" converters, and they can play an important role in a wide variety of systems. In many radio systems for example, the signal of interest is centered around some intermediate frequency (IF) which is distant from DC, and a bandpass converter is desirable for conversion of the IF signal to digital format, whereupon digital signal processing techniques can be applied to yield important improvements in the overall radio system performance. A digital receiver within an AM/FM radio is one example of a device that can benefit from the use of such a bandpass ADC.

The desire to extend the advantages of the delta-sigma conversion approach into the bandpass realm is evident from efforts disclosed in Ribner et al. U.S. Pat. No. 5,283,578 issued Feb. 1, 1994, Jackson U.S. Pat. No. 5,442,353 issued Aug. 15, 1995, and Singor et al., "Switched-Capacitor Bandpass Delta-Sigma A/D Modulation at 10.7 MHz", IEEE Journal of Solid-State Circuits, vol. 30, No. 3, Mar. 1995, pp 184–192, all of which are herein incorporated by reference. All of these disclosed approaches, however, fail to achieve the degree of performance displayed by lowpass delta-sigma conversion, in part because they implement "real" bandpass converters, in which a single input signal is converted to a single stream of digital output values.

In order to maintain the full performance of lowpass delta-sigma conversion in a bandpass delta-sigma converter, it would be necessary to implement a "complex" bandpass converter, which can be thought of as converting a pair of input signals X and Y into two streams of digital output values, one such stream representing the "real" or "in-phase" (I) component of the signal, and the other such stream representing the "imaginary" or "quadrature" (Q) component of the signal. It is convenient and common to represent the two output data streams I and Q as a single complex data stream I+jQ, where j is a symbol representing the square-root of −1. Similarly, it is conventional to represent the two input signals as a single complex input X+jY. To understand why complex conversion would be necessary to realize the full benefits of bandpass delta-sigma conversion, it is important to understand some factors that can limit the performance of delta-sigma converters in general. A brief description of these factors is provided below.

The advantage of delta-sigma conversion comes at some expense, namely that the quantization of the signal to low resolution produces noise in the output data stream. The important job of the modulator is to "shape" this quantization noise out of the frequency range which contains the desired signal, so that subsequent digital filtering operations can recover the desired signal without corruption. For a given oversampling ratio, increasing the converter performance in terms of output signal-to-noise ratio (SNR) or dynamic range requires increasing the modulator performance or complexity (known as the modulator "order"). If the modulator performance is essentially optimal, the only choice is to increase the modulator order.

As the modulator order increases, however, it becomes increasingly difficult to keep the converter stable, and a point of diminishing returns is rapidly reached. Thus to get the highest SNR or dynamic range performance from a delta-sigma converter, it is advantageous to keep the modulator order as low as possible consistent with the noise shaping requirements. From this standpoint, a real bandpass modulator is at a severe disadvantage compared to a lowpass modulator because a real bandpass modulator requires double the order of a lowpass modulator to achieve a given noise shaping characteristic. By contrast, a complex bandpass modulator of given order N achieves the same noise shaping characteristic as a lowpass modulator of order N. Put another way, an optimal complex bandpass modulator of order N achieves performance equivalent to an optimal real bandpass modulator of order N operating at twice the oversampling ratio.

An example of the significant advantages of the complex bandpass approach relative to the real bandpass approach is discussed in Jantzi et al., "Quadrature Bandpass ΔΣ Modulation for Digital Radio", IEEE Journal of Solid-State Circuits, vol. 32, No. 12, Dec. 1997, pp. 1935–1950, incorporated herein by reference, which discloses a 4th-order complex bandpass delta-sigma converter with SNR 21 dB higher than a complex bandpass converter composed of two real 4th-order bandpass delta-sigma converters. Theoretical analysis of delta-sigma converters indicates that SNR should improve by 3+6N dB per doubling of the oversampling ratio, where N is the modulator order. According to the previous discussion, this indicates that a 4th-order complex bandpass delta-sigma converter should have 27 dB higher SNR than a 4th-order real bandpass converter. Furthermore, using two real bandpass converters to make a complex bandpass converter should result in an SNR for the complex converter which is 3 dB better than the SNR of the constituent real converters. This predicts that Jantzi et al. should have achieved a 24 dB improvement rather than the 21 dB observed if the configuration was optimal.

Looking at the structure disclosed by Jantzi et al., the sub-optimal performance arises from the fact that the modulator is not truly 4th-order complex. Rather, two of the orders are complex bandpass, and another two of the orders form a real bandpass element. A fully complex modulator is not practical for this structure because component mismatches, which are inevitable in any real implementation, cause a catastrophic degradation of SNR due to mixing of quantization noise from negative frequencies to positive, and vice-versa. Component mismatches in this structure also cause image-rejection degradation, which occurs when input signals outside the frequency range of interest are mixed into the desired signal frequency range by the mismatches. Both of these effects prevent the structure disclosed from achieving optimal bandpass delta-sigma converter performance. The disclosed structure is still superior to using two real bandpass converters, or to other approaches such as disclosed in Ong et al., "A Two-Path Bandpass DS Modulator for Digital IF Extraction at 20 MHz", IEEE Journal of Solid-State Circuits, vol. 32, No. 12, Dec. 1997, pp. 1920–1934, incorporated herein by reference, which do not have strong cross-coupling between the I and Q paths. However, it still fails to realize the fill performance potential of bandpass delta-sigma conversion, due to its sensitivity to mismatches.

The requirement for strong cross-coupling in order to achieve optimal bandpass delta-sigma converter performance is discussed in Jantzi et al. and also discussed in Stikvoort U.S. Pat. No. 5,764,171 issued Jun. 9, 1998, incorporated herein by reference. Stikvoort discloses a complex bandpass delta-sigma converter which uses cross-coupling between two continuous-time modulators to improve the noise-shaping performance without increasing the modulator order. Continuous-time modulators, however, suffer from performance degradation due to amplifier and comparator slewing effects. These slewing effects can generally be reduced in switched-capacitor (discrete-time) modulators by designing for adequate settling between samples.

The problem of removing the effects of mismatches in complex bandpass modulators, however, remains. Severe degradation of SNR and image rejection due to mismatches prevent prior bandpass modulators from achieving the performance benefits of fully complex bandpass modulators. In prior modulators, no method is known for removing the degradation effects of mismatch, other than to reduce the mismatch to sufficiently low levels. Beyond certain levels, however, such mismatch reduction becomes difficult and impractical.

SUMMARY OF THE INVENTION

In accordance with the present invention, a discrete-time strongly cross-coupled complex bandpass modulator is disclosed that achieves the full potential of bandpass delta-sigma conversion by providing a strongly cross-coupled discrete-time complex loop filter structure with very low sensitivity to mismatches and by providing a simple scheme for correcting the effects of modulator mismatches. The complex bandpass modulator includes a plurality of non-linear resonators connected together and acting as a linear complex operator. Each resonator will act as a linear complex operator when an imaginary input signal is delayed by half a sample interval and an imaginary output signal is advanced by half a sample interval. In addition, degradation effects due to modulator mismatches are eliminated by digitally adjusting the relative gain of the real and imaginary paths following the output of the analog-to-digital converter and by adjusting the relative gain of the real and imaginary input signals.

DESCRIPTION OF THE PREFERRED EMBODIMENTS

Figure 1:
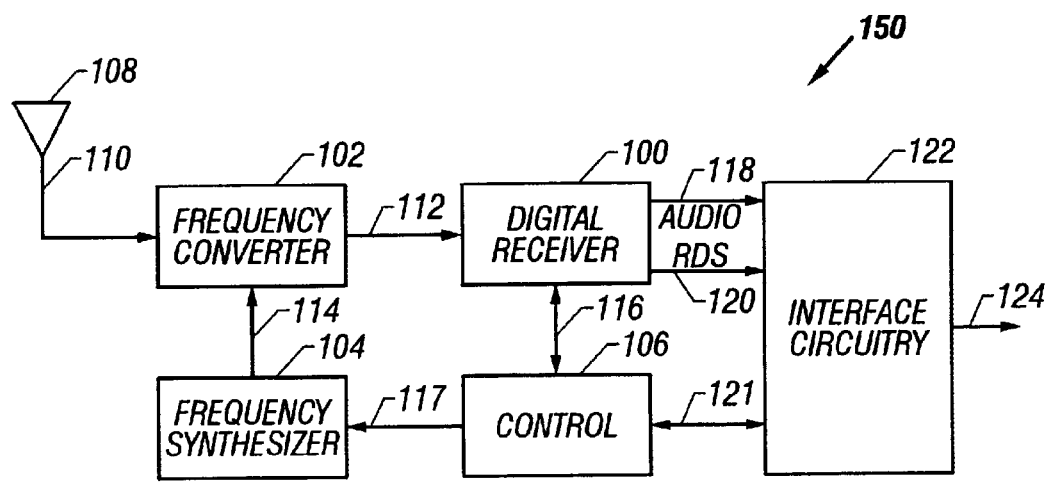
FIG. 1 is a block diagram of an embodiment for an intermediate frequency (IF) AM/FM radio receiver.

Referring now to FIG. 1, a block diagram is depicted for an embodiment of an intermediate frequency (IF) AM/FM radio receiver 150. Frequency converter circuitry 102 converts a radio frequency (RF) signal 110 received from the antenna 108 to an IF frequency 112. The frequency converter circuitry 102 utilizes a mixing signal 114 from a frequency synthesizer 104 to perform this conversion from the RF frequency range to the IF frequency range. Control circuitry 106 may apply a control signal 117 to frequency synthesizer 104 to choose the mixing signal 114 depending upon the station or channel that is desired to be received by the IF receiver 150. The digital receiver circuitry 100 processes the IF signal 112 and produces desired output signals, for example, audio output signals 118 and radio data system (RDS) output signals 120. These output signals may be provided to interface circuitry 122 and output to external devices through interface signals 124. The control circuitry 106 may communicate with the digital receiver circuitry 100 through signals 116 and may communicate with the interface circuitry 122 through signals 121. In addition, control circuitry 106 may communicate with external devices through the interface circuitry 122.

Figure 2:
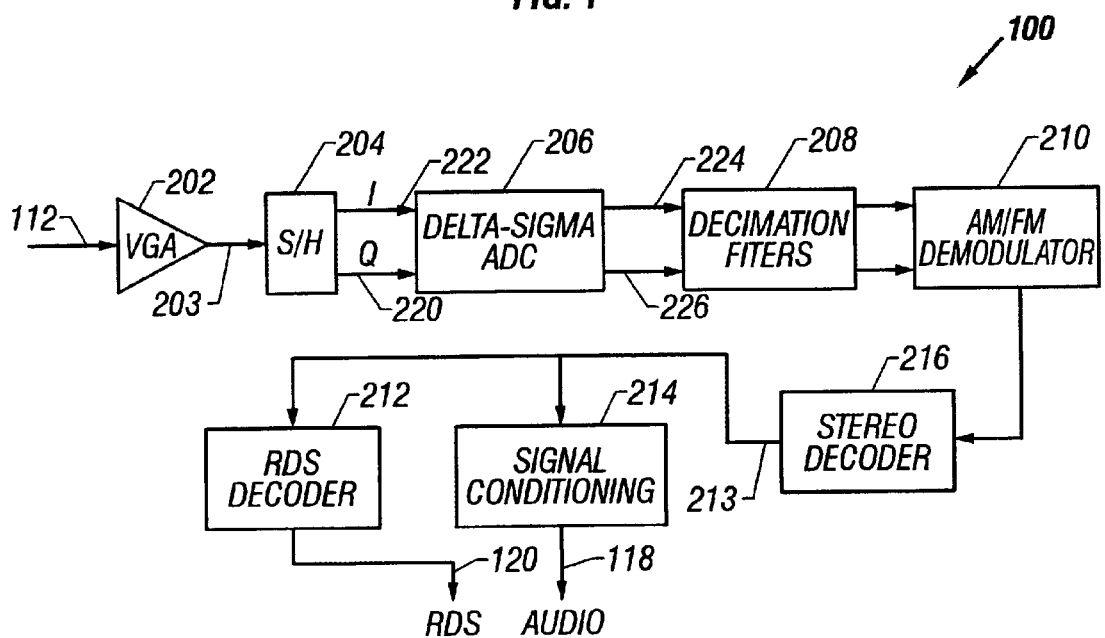
FIG. 2 is a block diagram of an embodiment for the digital receiver within the radio receiver.

FIG. 2 is a block diagram of an embodiment for the digital receiver 100. The IF input signal 112 is amplified by a variable gain amplifier (VGA) 202 to produce the signal 203. The signal 203 may be filtered with anti-aliasing filters if desired. Sample-and-hold (S/H) circuitry 204 samples the resulting signal and produces an in-phase (I) output signal 222 and a quadrature (Q) output signal 220. The S/H circuitry 204 may in some cases be comingled with the analog-to-digital converter (ADC) circuitry 206. The ADC circuitry 206 processes the I and Q signals 222 and 220 to form an I digital signal 224 and a Q digital signal 226. The ADC circuitry 206 may be for example two fifth order low-pass, or bandpass, delta-sigma ADCs that operate to convert the I and Q signals 222 and 220 to one-bit digital I and Q data streams 224 and 226. The digital output of the ADC circuitry 206 is passed through digital decimation filters 208 to complete channelization of the signals. The decimation filters 208 may also remove quantization noise caused by ADC 206 and provide anti-aliasing filtering.

Demodulation of the decimated I and Q digital data signals may be performed by AM/FM demodulator 210. The demodulator 210 may include for example a CORDIC processor that processes the digital I and Q data streams and outputs both the angle and magnitude of the I and Q digital data. For FM demodulation, the demodulator 210 may also perform discrete-time differentiation on the angle value outputs. Assuming the signals received are FM stereo signals, the output of the demodulator will be an FM multiplex spectrum signal 211. This FM multiplex signal 211 is then processed by stereo decoder 216 to decode the left and right channel information from the multiplexed stereo signal. The stereo decoder 216 may also provide additional signal processing as desired. Thus, the output signals 213 from the stereo decoder 216 may include, for example, a left channel (L) signal, a right channel (R) signal, a left-minus-right (L−R) signal, a left-plus-right (L+R) signal, and a 19 kHz pilot tone.

The signal conditioning circuitry 214 and the RDS decoder 200 receive signals 213 from the stereo decoder 216. It is noted that the signals received by the RDS decoder 200 and the signal conditioning circuitry 214 may be any of the signals produced by stereo decoder 216 and each may receive different signals from the other, as desired. The signal conditioning circuitry 214 may perform any desired signal processing, including for example detecting weak signal conditions, multi-path distortions and impulse noise and make appropriate modifications to the signals to compensate for these signal problems. The output of the signal conditioning circuitry 214 provides the desired audio output signals 118. The RDS decoder 212 recovers RDS data for example from a left-minus-right (L−R) signal available from the stereo decoder 216. The output of the RDS decoder 212 provides the desired RDS output signals 120, which may include RDS clock and data signal information.

Figure 3:
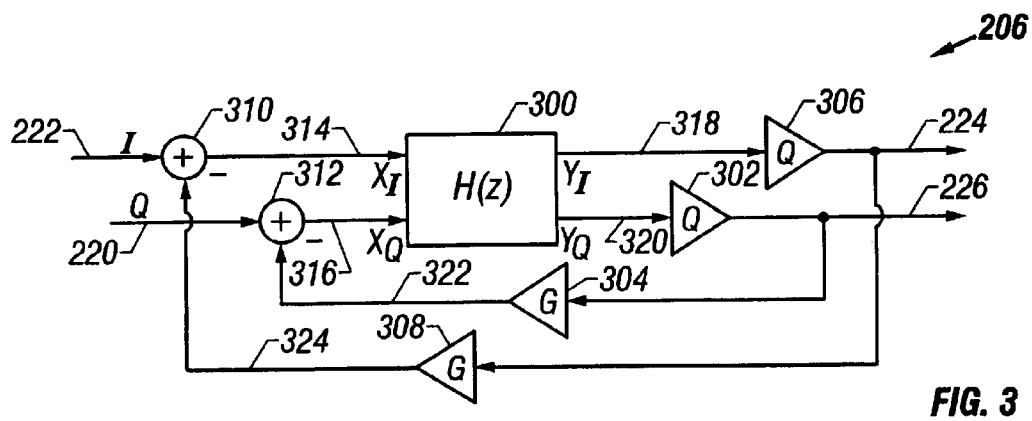
FIG. 3 is a block diagram of a delta-sigma analog-to-digital converter having a complex bandpass loop filter.

Referring now to FIG. 3, a block diagram is depicted of the delta-sigma analog-to-digital converter 206 comprising a complex bandpass loop filter 300 having a transfer function (H(z)). The in-phase signal (I) 222 is received by adder 310, which subtracts from it the feedback signal 324. The resulting in-phase signal ($X_I$) 314 is then provided to the complex loop filter (H(z)) 300. Similarly, quadrature signal (Q) 220 is received by adder 312, which subtracts from it the feedback signal 322. The resulting quadrature signal ($X_Q$) 316 is then provided to the complex loop filter (H(z)) 300. The complex loop filter (H(z)) 300 processes the input signals ($X_I$) 314 and ($X_Q$) 316 to produce an in-phase output signal ($Y_I$) 318 and a quadrature output signal ($Y_Q$) 320. These outputs signals ($Y_I$) 318 and ($Y_Q$) 320 are then converted to digital information through quantizers (Q) 306 and 302, respectively. The output of quantizer (Q) 306 is the in-phase digital signal 224, and the output of the quantizer (Q) 302 is the quadrature digital signal 226. The in-phase digital signal 224 is passed through a digital-to-analog converter 308 having a desired gain (G) to generate the feedback signal 324. Similarly, the quadrature signal 226 is passed through a digital-to-analog converter 304 having a desired gain (G) to generate the feedback signal 322. The gains (G) for the digital-to-analog converters 304 and 308 may be matched or may be different if so desired.

In the process of converting filter output signals 318 and 320 to digital signals 224 and 226, the quantizers 306 and 302 produce undesirable noise known as quantization noise. Left uncontrolled, quantization noise will interfere with the desired signal to an unacceptable degree. Quantization noise is controlled through the combined action of the feedback signals 322 and 324 and the action of the filter 300. This combined action causes the quantization noise to be "shaped" away from the frequency range which contains the desired signal, so that the desired signal can be recovered without interference from the quantization noise by passing it through the decimation filters subsequent to the ADC 206.

Figure 4A:
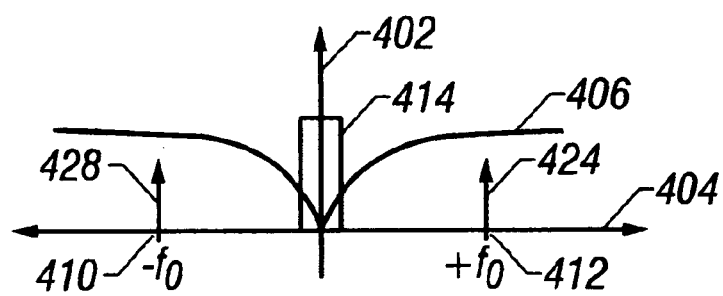
FIGS. 4A, 4B and 4C are example diagrams of noise shaping profiles.
Figure 4B:
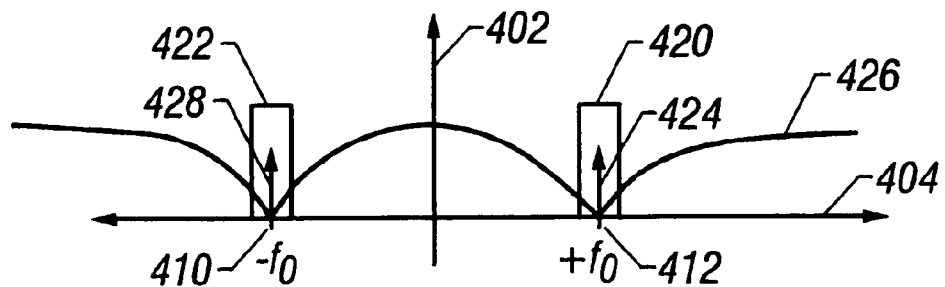
Figure 4C:
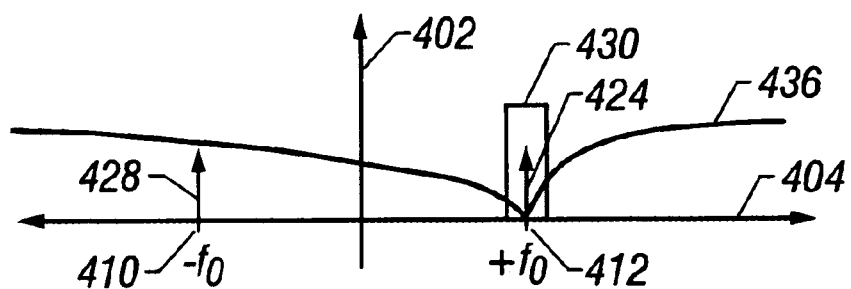

FIGS. 4A, 4B and 4C are example diagrams of noise shaping profiles that could potentially be designed for the filter (H(z)) 300. Also shown in FIGS. 4A–4C are the signal regions 414, 420, 422 and 430 containing desired signals which will be allowed to pass through the decimation filters following the ADC. FIG. 4A represents a low-pass noise shaping profile 406 for a delta-sigma ADC 206. FIG. 4B represents a real bandpass noise shaping profile 426 for delta-sigma ADC 206. FIG. 4C represents a complex bandpass noise shaping profile 436 for a delta-sigma ADC 206. In each of FIGS. 4A–4C, the x-axis 404 represents frequency, and the y-axis 402 represents the level of signal or noise at any particular frequency. The input signal of interest will typically be a signal 424 centered at a positive frequency (+$f_0$) 412. This input signal 424 will also typically have a corresponding signal 428 centered at a negative frequency (−$f_0$) 410. When the input signal is real, the signal 428 at negative center frequency (−$f_0$) 410 carries the same information as signal 424, and is desirable. When the input signal is complex, consisting of real and imaginary parts, the signal 428 at negative center frequency (−$f_0$) 410 is referred to as the image signal, which does not contain desirable information.

The low-pass noise shaping profile 406 of FIG. 4A is useful where the signal of interest has been moved to baseband (i.e., DC where frequency=0). Thus, the noise shaping profile 406 allows for a signal region 414 around DC in which noise will not be generated to obscure the signal. In contrast, the real bandpass noise shaping profile 426 of FIG. 4B could be used where the real signal of interest is present at desired positive center frequency (+$f_0$) 412 as well as desired negative center frequency (−$f_0$) 410. Thus, the noise shaping profile 426 allows for two signal regions 420 and 422 around the positive and negative center frequencies (+$f_0$) 412 and (−$f_0$) 410 in which noise will not be generated. Finally, the complex bandpass shaping profile 436 of FIG. 4C is useful where the complex signal of interest is at some desired positive center frequency (+$f_0$) 412. The complex bandpass shaping profile 436 has a signal region 430 around only the positive center frequency (+$f_0$) 412 in which noise will not be generated. This final noise shaping profile is highly desirable because it tends to achieve the maximum possible performance for a given complexity of modulator, far exceeding the performance of a real bandpass modulator of the same complexity. Since a real signal can be trivially converted to and from a complex signal, the complex bandpass configuration of FIG. 4C can easily be used as an ADC for real signals, making the real bandpass configuration of FIG. 4B of questionable practical value.

The complex bandpass configuration depicted in FIG. 4C requires that the filter transfer function (H(z)) described with respect to FIG. 3 represent a linear complex operation. If (H(z)) represents a non-linear operation, the non-linearity will cause quantization noise from near the negative center frequency (−$f_0$) 410 to be folded into the positive frequency region near the positive center frequency (+$f_0$) 412. This folded noise obscures the desired signal 424 in the same frequency region, degrading the performance of the ADC. Similarly, non-linearity causes image signal 428 to be folded into the positive frequency region near the positive center frequency (+$f_0$) 412. This folded image signal also obscures the desired signal 424 and degrades the performance of the ADC whenever image signal 428 is present in the input signal. Thus, for optimal performance of the ADC, the filter transfer function (H(z)) must represent a linear complex operation. This requirement can be expressed with respect to the FIG. 3 filter input and output signals ($X_I$) 314, ($X_Q$) 316, ($Y_I$) 318, and ($Y_Q$) 320 by the following matrix equation:

$$\begin{pmatrix} Y_I \\ Y_Q \end{pmatrix} = \begin{pmatrix} H_I(z) & -H_Q(z) \\ H_Q(z) & H_I(z) \end{pmatrix} \begin{pmatrix} X_I \\ X_Q \end{pmatrix} \quad \text{(Matrix Equation 1)}$$

where $H_I(z)$ and $H_Q(z)$ represent respectively real linear in-phase and quadrature constituent transfer functions which combine to form the complex transfer function (H(z)) according to the relationship $H(z)=H_I(z)+jH_Q(z)$.

Figure 5A:
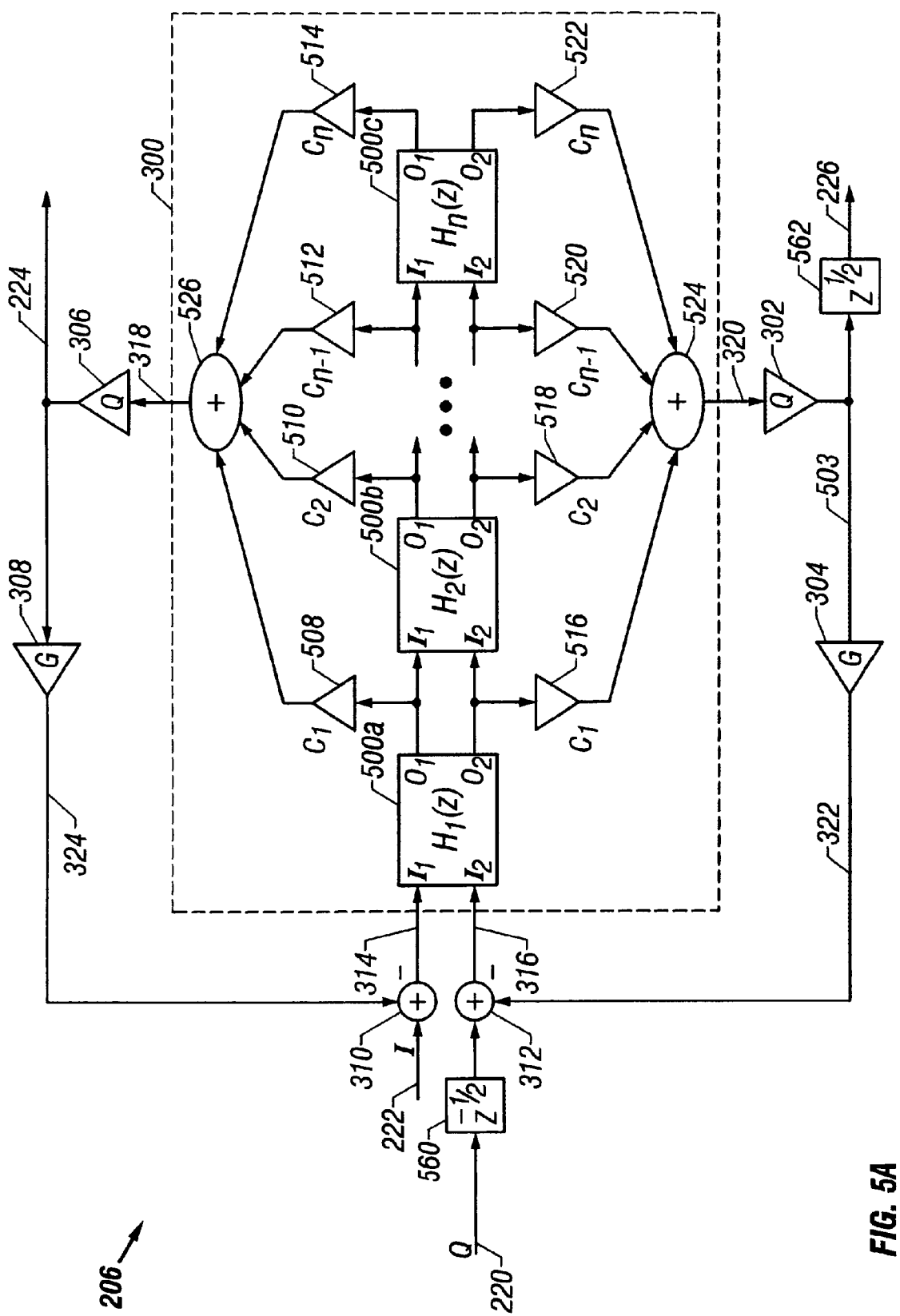
FIG. 5A is block diagram of an embodiment for a complex bandpass modulator.

FIG. 5A is block diagram of an embodiment of the complex bandpass delta-sigma analog-to-digital converter 206. The basic building blocks for the complex loop filter 300 are the resonators ($H_1(z)$, $H_2(z)$ . . . $H_n(z)$) 500a, 500b . . . 500c. The number of these resonators 500 that are connected together, which may be one or more, depends upon the application and noise shaping desired. For example, three resonators 500 could be connected together to achieve a complex bandpass noise shaping profile in which the quantization noise is reduced to zero at three separate points within the desired signal frequency range. As depicted in FIG. 5A, the resonators 500a, 500b and 500c each have two input signals ($I_1$ and $I_2$) and two output signals ($O_1$ and $O_2$) with output signals ($O_1$ and $O_2$) of a first resonator ($H_1(z)$) 500a being provided as the two input signals for the second resonator ($H_2(z)$) 500b, and so on. The first of each of these input and output signals ($I_1$ and $O_1$) make up an in-phase path, while the second of each of these input and output signals ($I_2$ and $O_2$) make up a quadrature path.

The complex loop filter 300 provides the in-phase unquantized signal 318 and the quadrature unquantized signal 320 to quantizers (Q) 306 and 320, respectively. To create these two signals 318 and 320, the two output signals ($O_1$ and $O_2$) from each resonator ($H_1(z)$, $H_2(z)$ . . . $H_n(z)$) 500a, 500b . . . 500c are passed through coefficient blocks to provide weighted portions of summed values that make up the two unquantized signals 318 and 320. In particular, the in-phase output signals ($O_1$) are passed through coefficient blocks 508, 510 . . . 512 and 514, respectively, and summed by adder 526 to produce in-phase unquantized signal 318. Similarly, the quadrature output signals ($O_2$) are passed through coefficient blocks 516, 518 . . . 520 and 522, respectively, and summed by adder 524 to produce quadrature unquantized signal 320. As depicted, the coefficient blocks have matched coefficients, such that coefficient blocks 508 and 516 have the same coefficient ($c_1$), coefficient blocks 510 and 518 have the same coefficient ($c_2$) . . . coefficient blocks 512 and 520 have the same coefficient ($c_{n-1}$), and coefficient blocks 514 and 522 have the same coefficient ($c_n$).

Quantizers (Q) 302 and 306, digital-to-analog converters 304 and 308, and adders 310 and 312 operate as described above with respect to FIG. 3. Different from FIG. 3, however, are the delay block ($z^{-1/2}$) 560 and the advance block ($z^{1/2}$) 562. In particular, the quadrature input signal (Q) 220 is passed through the delay block ($z^{-1/2}$) 560 before going to the adder 312. The output 503 from the quantizer (Q) 302 is passed through advance block ($z^{1/2}$) 562 before becoming the quadrature digital signal 226. The purpose for these two additional blocks is described in more detail with respect to FIGS. 6 and FIGS. 7A–7D.

Figure 6:
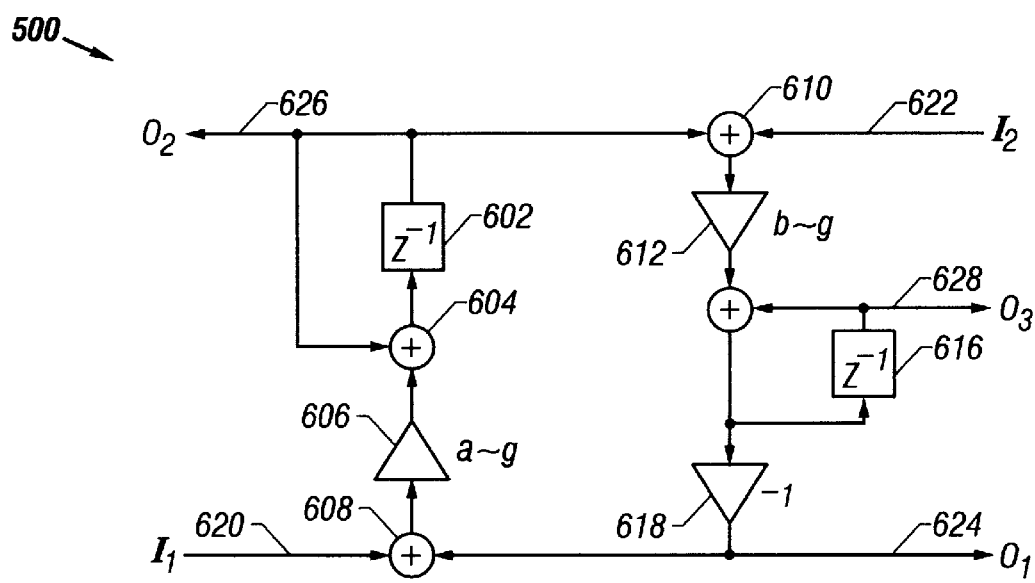
FIG. 6 is a block diagram of an embodiment for a resonator for the complex bandpass loop filter of FIG. 5A.

FIG. 6 is a block diagram of an embodiment for a resonator 500 for the complex filter 300. As depicted, the resonator 500 has two input signals ($I_1$, $I_2$) 620 and 622, and three possible output signals ($O_1$, $O_2$, $O_3$) 624, 626 and 628. It is noted that the resonators 500a, 500b and 500c depicted in FIG. 5A are using the two inputs signals ($I_1$, $I_2$) 620 and 622 and two of the three output signals ($O_1$, $O_2$) 624 and 626.

Referring now to the details of FIG. 6, adder 608 receives the inputs signal ($I_1$) 620 and the output signal ($O_1$) 624. The output from adder 608 passes through coefficient block 606 and then to adder 604. Adder 604 also receives the output signal ($O_2$) 626. The output from adder 604 passes through delay block ($z^{-1}$) 602 to provide the output signal ($O_2$) 626. Adder 610 receives the input signal ($I_2$) 622 and the output signal ($O_2$) 626. The output from adder 610 passes through coefficient block 612 and then to adder 614. Adder 614 also receives the output signal ($O_3$) 628. The output from adder 614 passes through delay block ($z^{-1}$) 616 to provide the output signal ($O_3$) 628. The output from adder 614 is also passed through coefficient block 618 to provide the output signal ($O_1$) 624. Coefficient block 618 has a coefficient of −1. Coefficient block 606 has a coefficient of a, and coefficient block 612 has a coefficient of b. It is noted that adder 604 and delay block ($z^{-1}$) 602, as well as adder 614 and delay block ($z^{-1}$) 616, are connected to form integrators. It is further noted that the values for coefficients a and b may be selected as desired depending upon the application and desired noise shaping. As depicted, the coefficients for coefficient blocks 606 and 612 are equivalent such that $a=b \sim g$.

In operation, the resonator 500 of FIG. 6 provides a non-linear response that does not fit the form of Matrix Equation 1, required for a complex operator. As will be shown below however, when the resonator 500 of FIG. 6 is combined in a modulator with the delay block ($z^{-1/2}$) 560 and advance block ($z^{1/2}$) 562 described with respect to FIG. 5A, the resulting modulator is equivalent to one in which the non-linear resonator 500 is replaced by a linear resonator. As depicted, the output signals ($O_1$, $O_2$) 624 and 626 of the resonator 500 may be represented by the following equation, which is presented in matrix form:

$$\begin{pmatrix} O_1 \\ O_2 \end{pmatrix} = \qquad \text{(Matrix Equation 2)}$$

$$\frac{1}{z^2 + z(ab-2) + 1} \begin{pmatrix} -zab & zb(1-z) \\ -a(1-z) & -zab \end{pmatrix} \begin{pmatrix} I_1 \\ I_2 \end{pmatrix}$$

It is also noted that the third output signal ($O_3$) 628 may be represented by $O_3 = -z^{-1} O_1$.

To transform this equation to one which represents a linear complex operator, a substitution may be made such that $I_2' = z^{1/2} I_2$ and $O_2' = z^{1/2} O_2$. In addition, to simplify the equations, it may be assumed that the $a=b\sim g$. It should be noted that this assumption is made only to simplify the equations and allow clearer explanation. (Having $a \neq b$ results in a minor modification which is described in more detail with respect to FIG. 9.) With these simplifications, the matrix equation above becomes the following:

$$\begin{pmatrix} O_1 \\ O_{2'} \end{pmatrix} = \frac{1}{z^2 + z(g^2 - 2) + 1} \qquad \text{(Matrix Equation 3)}$$

$$\begin{pmatrix} -zg^2 & z^{1/2}g(1-z) \\ -z^{1/2}g(1-z) & -zg^2 \end{pmatrix} \begin{pmatrix} I_1 \\ I_{2'} \end{pmatrix}$$

which is the correct form for a linear complex operator.

This linear complex operator of Matrix Equation 3 describes a resonator that may be represented by the form $H(z) = O/I = [O_1 + jO_2']/[I_1 + jI_2']$. Substituting into this equation the expressions from Matrix Equation 3 and simplifying, the resonator may be represented by $H(z) = [jgz^{1/2}]/[z - jgz^{1/2} - 1]$. Significantly, for $-2 \leq g \leq 2$, there is only one complex pole for the resonator H(z), and it lies on the unit circle at an angle (u) that may be represented by $u = 2 \sin^{-1}(g/2)$.

Figure 7A:
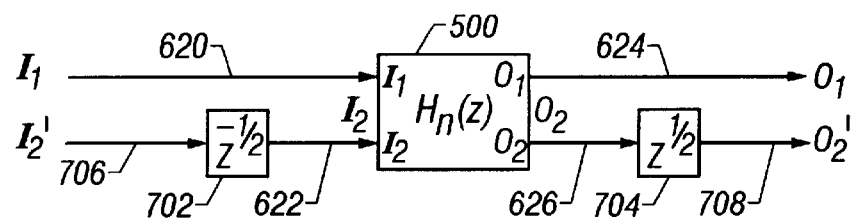
FIG. 7A is a block diagram representing a functional depiction of the resonators depicted with respect to FIG. 6.

FIG. 7A is a block diagram representing a functional depiction of the resonator 500 to better describe the reason for the delay block ($z^{-1/2}$) 560 and the advance block ($z^{1/2}$) 562 in FIG. 5A in light of the equations above. In FIG. 7A, a single resonator 500 is depicted with the addition of a delay block ($z^{-1/2}$) 702 and an advance block ($z^{1/2}$) 704. The delay block ($z^{-1/2}$) 702 causes the input signal ($I_2$) 622 to be delayed with respect the input signal ($I_2'$) 706. The advance block ($z^{1/2}$) 704 causes the output signal ($O_2'$) 708 to be advanced with respect to the output signal ($O_2$) 626. The diagram in FIG. 7A matches the desired functional result for a linear complex operator as described above with respect to Matrix Equation 3. )While this resonator block as depicted in FIG. 7A cannot be directly implemented because of the $z^{1/2}$ and $z^{-1/2}$ operations, such resonator blocks can be connected together to form a functional representation of a complex bandpass modulator for a delta-sigmna ADC.

Figure 7B:
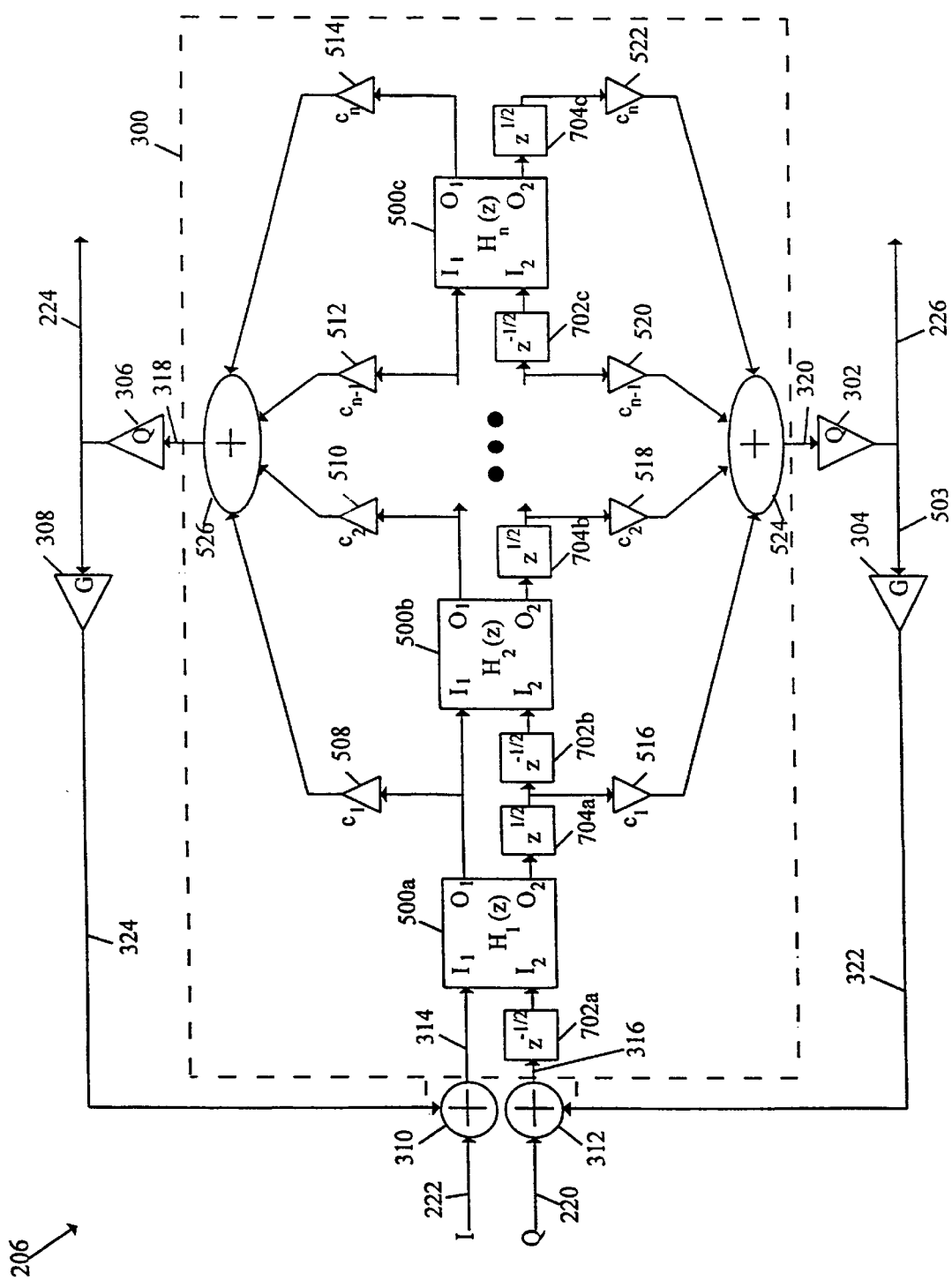
FIG. 7B is a block diagram representing a complex bandpass modulator composed of unrealizable linear complex resonator blocks.

FIG. 7B is a block diagram of a complex bandpass modulator in which the complex loop filter 300 is composed of a series of linear complex resonator blocks as depicted in FIG. 7A. Through a series of steps depicted in FIGS. 7C–7D, it is shown that the complex bandpass modulator depicted in FIG. 7B is functionally equivalent to the complex bandpass modulator depicted in FIG. 5A.

Figure 7C:
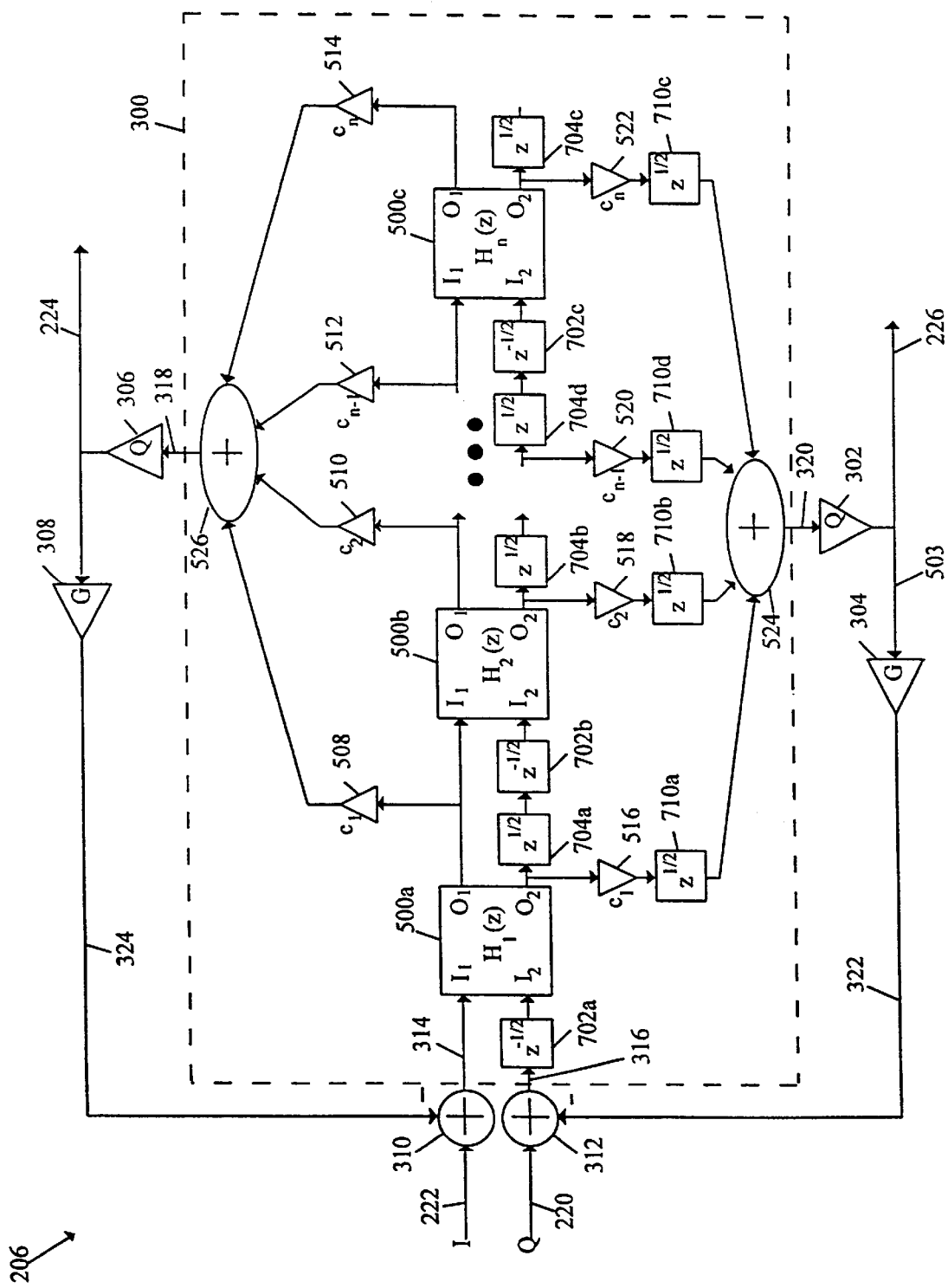
FIGS. 7C and 7D are block diagrams representing functional depictions equivalent to the complex bandpass modulator depicted in FIGS. 7B and 5A.

Turning now to FIG. 7C, the connection points for the imaginary path coefficient blocks ($c_1$) 516, ($c_2$) 518, . . . ($c_n$) 522 have been moved from after the advance blocks ($z^{1/2}$) 704a, 704b, . . . 704c as depicted in FIG. 713 to the outputs $O_2$ associated with the resonators 500a, 500b, . . . 500c. At the same time, additional advance blocks ($z^{1/2}$) 710a, 710b, . . . 710d, 710c are introduced after the coefficient blocks ($c_1$) 516, ($c_2$) 518, . . . ($C_{n-1}$) 520, ($c_n$) 522. This change has no effect on the function of the modulator, because the order of coefficient block and advance block can be interchanged with no effect. As depicted now in FIG. 7C, the advance block ($z^{1/2}$) 704a associated with resonator 500a and the delay block ($z^{-1/2}$) 702b associated with resonator 500b will cancel each other. This cancellation of advance blocks ($z^{1/2}$) and delay blocks ($z^{-1/2}$) will occur between each two resonators in the chain of resonators 500a, 500b, . . . 500c. The advance block ($z^{1/2}$) 704c associated with resonator 500c is no longer required, because there is nothing connected to its output.

Figure 7D:
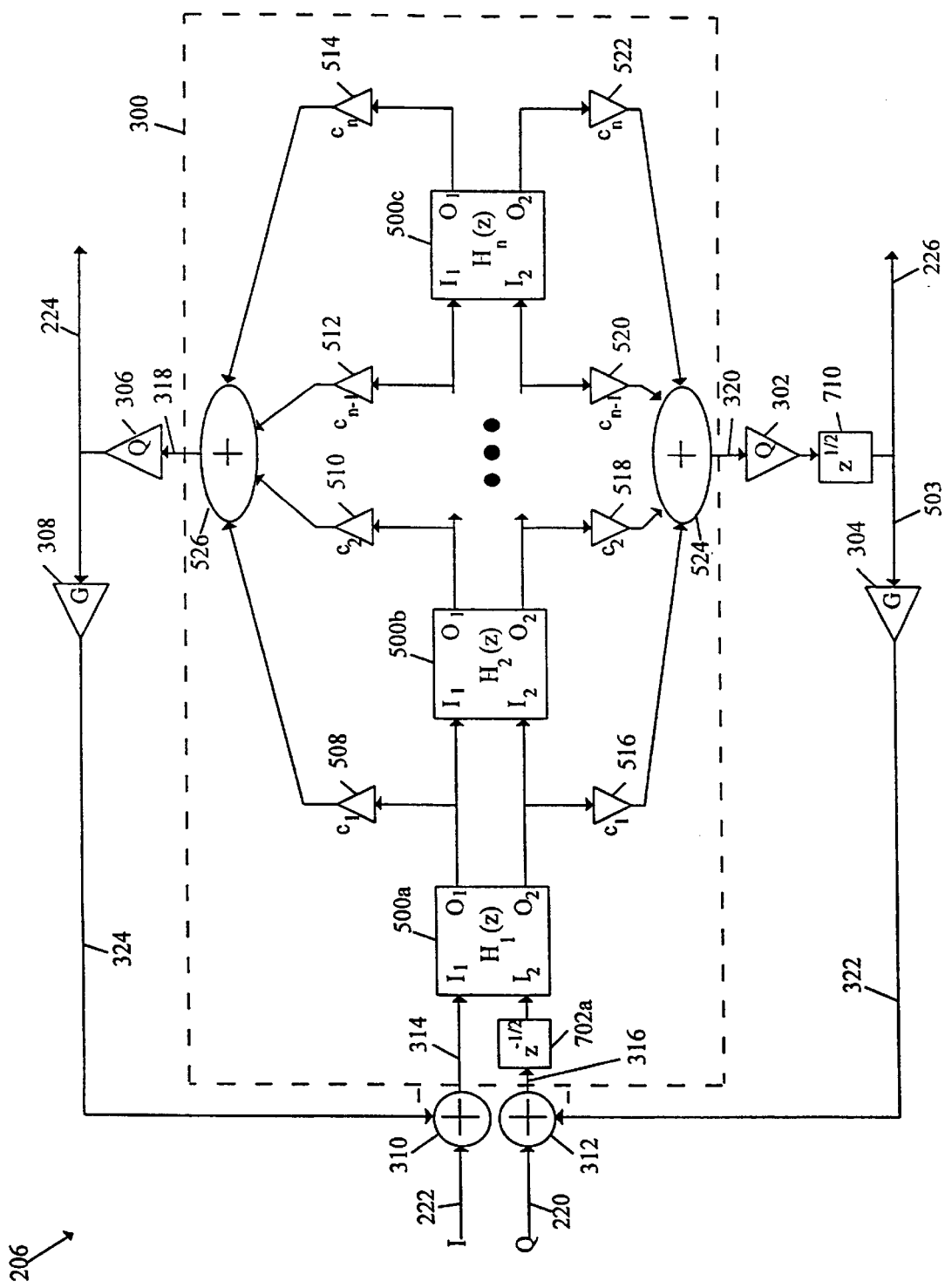

Turning now to FIG. 7D, the modulator of FIG. 7C is shown with the cancelled advance and delay blocks eliminated. Furthermore, the additional advance blocks ($z^{1/2}$) 710a, 710b, . . . 710d, 710c have been replaced by a single advance block ($z^{1/2}$) 710 at the output of the imaginary path quantizer 302. This change has no effect on the function of the modulator, because the order of addition and advance blocks can be interchanged with no effect, and the order of quantization and advance blocks can also be interchanged with no effect. From this point, the advance block ($z^{1/2}$) 710 can be interchanged with the imaginary path gain block 304 and the imaginary feedback path adder 312 to cancel with the remaining imaginary path delay block ($z^{-1/2}$) 702a associated with resonator 500a. In order for this change to have no functional effect, additional advance block ($z^{1/2}$) 562 depicted in FIG. 5A must be added in the imaginary output path to offset the elimination of advance block ($z^{1/2}$) 710, and additional delay block ($z^{-1/2}$) 560 depicted in FIG. 5A must be added in the imaginary input path to offset the elimination of delay block ($z^{-1/2}$) 702a. With these last changes, the modulators of FIGS. 7B–7D are seen to be functionally identical to the modulator depicted in FIG. 5A.

Referring now back to FIG. 5A, the operation is further described. If the input signal is real, the delay block ($z^{-1/2}$) 560 may be ignored in the path for the quadrature input signal (Q) 220. This is so because the quadrature input signal (Q) 220 will be zero. If the input is complex, the delay block ($z^{-1/2}$) 560 indicates that the quadrature (or imaginary) input signal (Q) 220 must be delayed by half a sample interval relative to the in-phase (or real) input signal before appearing at the quadrature feedback adder block 312. On the output side, the advance block ($z^{1/2}$) 562 indicates that in order to get the proper complex output, the quadrature (or imaginary) quantizer (Q) 302 digital output sequence 503 must be advanced half a sample interval with respect to the in-phase (or real) digital output sequence 224. In particular, the output signal 503 from the quantizer (Q) 302 is advanced by half a sample interval by the advance block ($z^{1/2}$) 562 to provide the quadrature (or imaginary) digital output signal 226.

Another way to look at the effect of the delay block ($z^{-1/2}$) 560 is to assume that the resonator blocks operate at some sample rate of $f_s$, and the input sequences seen at the feedback adders 310 and 312 are:

| | |
|---|---|
| in-phase (real) input at adder 310 | $ri_1\ ri_2\ ri_3\ ri_4$ . . . |
| quadrature (imaginary) input at adder 312 | $ii_1\ ii_2\ ii_3\ ii_4$ . . . |

Then, an equivalent complex input stream at sample rate of $2f_s$ given by:

| in-phase (real) input (I) 222 | 0 ri$_1$ 0 ri$_2$ 0 ri$_3$ 0 ri$_4$ ... |
|---|---|
| quadrature (imaginary) input (Q) 220 | ii$_1$ 0 ii$_2$ 0 ii$_3$ 0 ii$_4$ 0 ... |

Similarly, to understand the effect of the advance block ($z^{1/2}$) 562, assume that the quantizer output sequences at sample rate of $f_s$ are:

in-phase (real) quantizer output 224 ro$_1$ro$_2$ro$_3$ro$_4$ ...

quadrature (imaginary) quantizer output 503 io$_1$io$_2$io$_3$io$_4$ ...

Then, the actual output is recovered from the complex-interleaved output at sample rate of $2f_s$ given by:

| in-phase (real) output 224 | 0 ro$_1$ 0 ro$_2$ 0 ro$_3$ 0 ro$_4$ ... |
|---|---|
| quadrature (imaginary) output 226 | io$_1$ 0 io$_2$ 0 io$_3$ 0 io$_4$ 0 ... |

The orthogonality of the outputs, when viewed at the $2f_s$ rate, indicates that mismatches between the in-phase (real) and quadrature (imaginary) feedback gain (G) can be corrected by a corresponding gain correction on the output signals. Similarly, the orthogonality of the inputs, when viewed at the $2f_s$ rate, indicates that gain mismatches in the resonator input paths $I_1$ and $I_2$ can be corrected by a corresponding gain correction on the input signals. This is a desirable property not available with other complex modulators.

In general, mismatches of all types may contribute degradation in one of two ways: (1) by folding quantization noise into the desired signal frequency range or (2) by folding image signal into the desired signal frequency range. Unlike other modulators, the modulator of FIG. 5A allows a simple means for detection and correction of these degradations. The details of this detection and correction is described in more detail with respect to FIG. 10. In addition, the circuitry of FIG. 5A provides a low initial sensitivity to mismatches, in particular, low sensitivity to a/b mismatches (which ratio must nominally be equal in all resonators 500a, ... 500b ... 500c), as well as $I_1/I_2$ gain mismatches. A low sensitivity means that small changes from ideal values do not result in a rapid filling of the noise zeros in the noise shaping profile of the modulator, nor do they result in a rapid degradation of the image signal rejection.

Figure 5B:
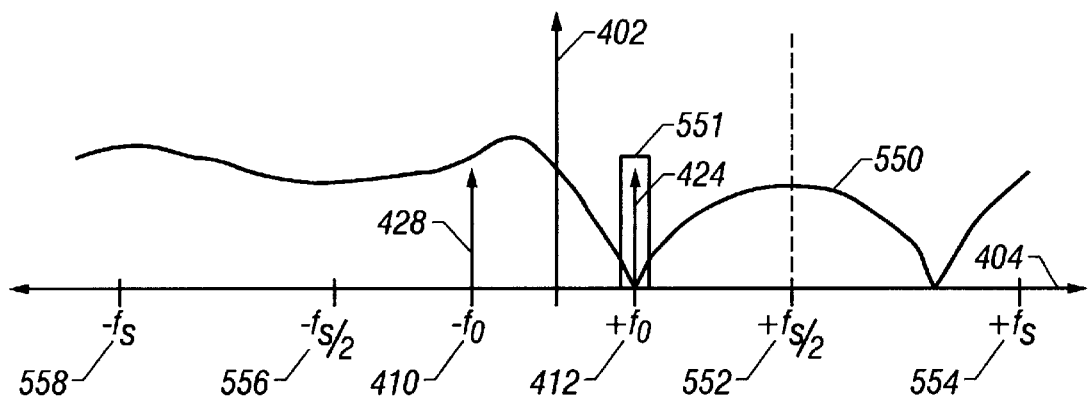
FIG. 5B is a graphical depiction of a noise shaping profile for the complex bandpass modulator of FIG. 5A viewed at a two-times sampling rate.

FIG. 5B is a graphical depiction for the noise shaping profile 550 for the complex bandpass modulator 206 of FIG. 5A viewed at a two-times sampling rate ($2f_s$). Viewed at the $2f_s$ rate, the output noise shaping profile has two zero regions, placed symmetrically about $f_s/2$. The x-axis represents frequency, and the y-axis represents the level of signal or noise at any particular frequency. The location of the noise zero contributed by each resonator 500a, 500b, ... 500c is given by $f_{zero}=(f_s/\pi)\sin^{-1}(g/2)$. Each resonator 500a, 500b, ... 500c can use a different value for g in order to distribute noise zeros optimally throughout the frequency range of the desired signal 424. As depicted, the noise shaping profile 550 allows for a signal region 551 around the positive center frequency (+$f_0$) 412 in which signals will not be corrupted by quantization noise. The noise shaping profile 550 is symmetric about $f_s/2$ frequency 552. The negative sampling frequency ($-f_s$) 558, the positive sampling frequency (+$f_s$), and the $-f_s/2$ frequency 552 are also shown in FIG. 5B. This noise shaping profile 550 indicates that the complex bandpass modulator 206 obtains the performance of a mismatch-insensitive real bandpass modulator operating at $2f_s$ while using a complex modulator structure that actually only operates at $f_s$. This result provides for significant advantages in regard to SNR and dynamic range relative to other modulators of the same complexity.

Figure 8:
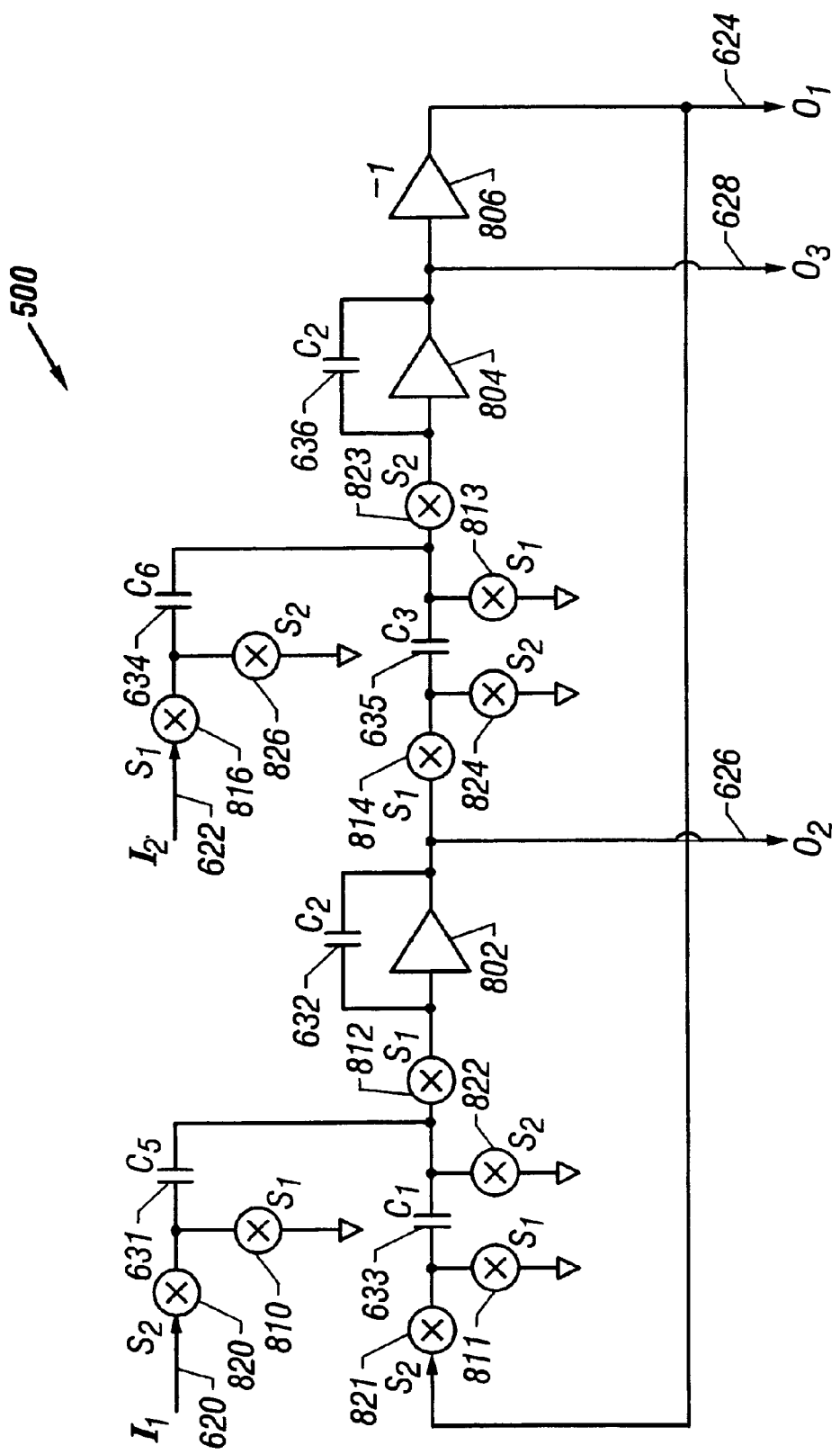
FIG. 8 is a circuit diagram for an embodiment of a switched-capacitor circuit implementation for the resonator depicted with respect to FIG. 6.

FIG. 8 is a circuit diagram for an embodiment of a switched-capacitor circuit implementation for the resonator 500 depicted with respect to FIG. 6. The input signal ($I_1$) 620 charges capacitor ($C_5$) 631 through the operation of switches 820 and 822. Similarly, the input signal ($I_2$) 622 charges capacitor ($C_6$) 634 through the operation of switches 816 and 813. Capacitor ($C_1$) 633 is charged by the output signal ($O_1$) 624 through the operation of switches 821 and 822. The charges on capacitor ($C_5$) 631 and capacitor ($C_1$) 633 are provided to capacitor ($C_2$) 632 through the operation of switches 810, 811 and 812 together with the action of operational amplifier (OP AMP) 802. The output of OP AMP 802 is output signal ($O_2$) 626 and also charges capacitor ($C_3$) 635 through the operation of switches 814 and 813. The charges on capacitor ($C_6$) 634 and capacitor ($C_3$) 635 are provided to capacitor ($C_4$) 636 through the operation of switches 824, 826 and 823 together with the action of operational amplifier (OP AMP) 804 . The output of OP AMP 804 is output signal ($O_3$) 628 and is passed through $-1$ gain block 806 to produce output signal ($O_1$) 624. In a fully-differential implementation of the circuitry of FIG. 6, the $-1$ gain block 806 is accomplished trivially by the interchange of the positive and negative output signals from OP AMP 804. Advantageously, this switched-capacitor implementation of has no delay-free loops or cascaded settling times.

In operation, the switches of FIG. 8 are controlled by either a first phase signal ($S_1$) or a second phase signal ($S_2$). The controlling phase signal is indicated next to each switch in FIG. 8. Thus, switches 810, 811, 812, 813, 814 and 816 are controlled by the first phase signal ($S_1$), and switches 820, 821, 822, 823, 824 and 826 are controlled by the second phase signal ($S_2$). The values for the capacitors within FIG. 8 define the value of the coefficients a and b as depicted in FIG. 5. In particular, $C_1/C_2$=a and $C_3/C_4$=b. In addition, the capacitors have the relationship that $C_5=C_1$ and $C_6=C_3$.

While there is no cascaded settling time within the resonator 500, or from one resonator 500 to the next in the complex loop filter 300, there will be cascaded settling from $O_1$ through the in-phase (real) path quantizer 306 and into $I_1$. Similarly, there is cascaded settling from $O_2$ through the quadrature (imaginary) path quantizer 302 and into $I_2$. To eliminate this cascaded settling, the quantizers 302 and 306 can be implemented to include a delay block at their outputs that delays the quantized output signals by one clock phase. This modification will have no effect on the $O_2$ to $I_1$ or the $O_3$ to $I_2$ signal paths, but it will introduce a full $z^{-1}$ into the $O_1$ to $I_1$ and $O_2$ to $I_2$ signal paths.

Figure 9:
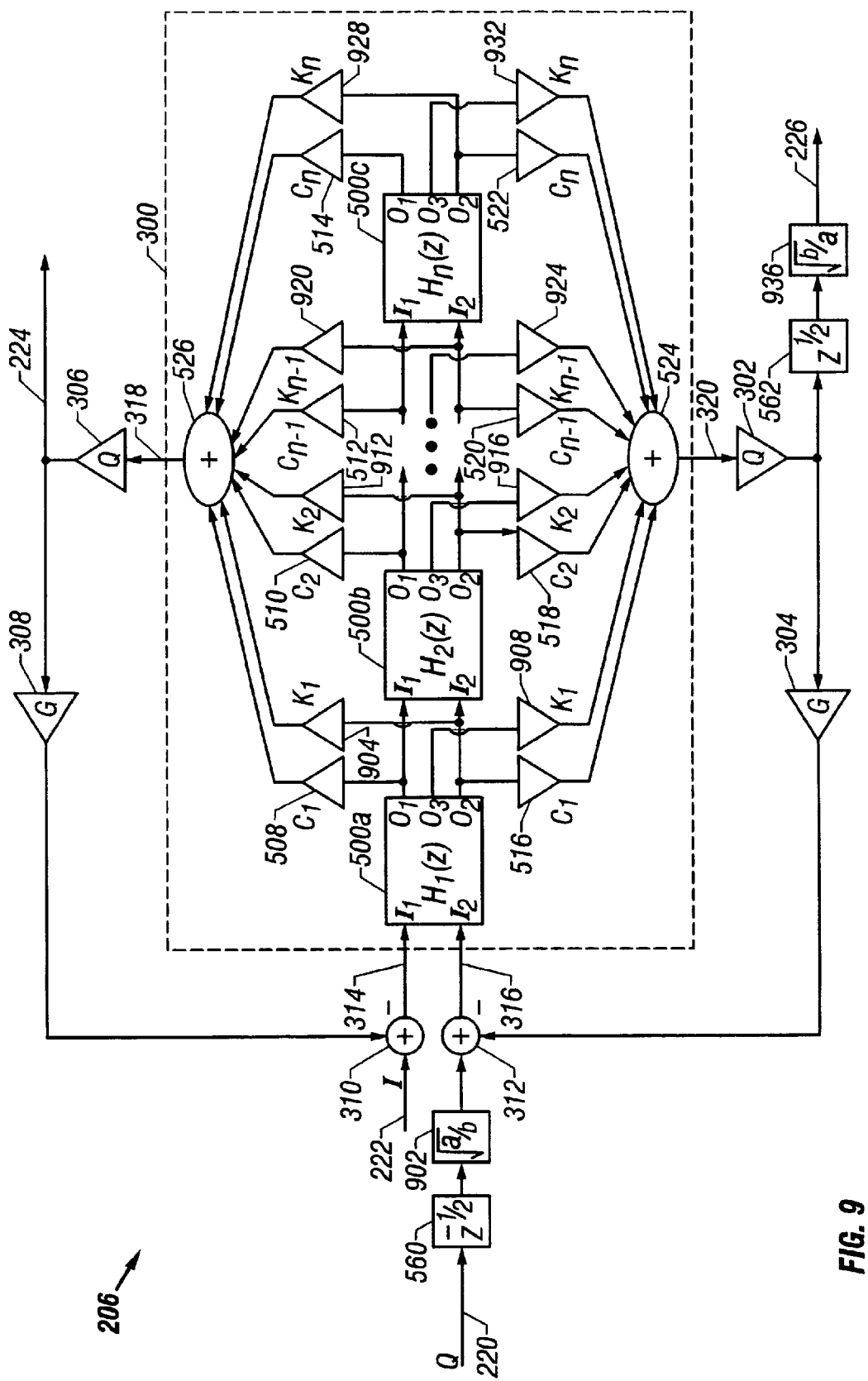
FIG. 9 is a block diagram of an alternative embodiment for a complex bandpass modulator.

FIG. 9 is a block diagram of an alternative embodiment for a complex loop filter 300 within a complex bandpass analog-to-digital converter 206. The resonator 500 as depicted in FIG. 6 allows for various complex bandpass configurations, in particular with respect to the third output signal ($O_3$) 628. The alternative embodiment of FIG. 9 is different from the embodiment of FIG. 5A in that additional signals with related coefficient values are provided to the adders 524 and 526. In the in-phase (real) path, a second signal from the second output signal ($O_2$) of each of the resonators 500a, 500b ... and 500c is passed through coefficient blocks 904, 912, 920 ... and 928 to the adder 526. In the quadrature (imaginary) path, a second signal from the third output signal ($O_3$) of each of the resonators 500*a*, 500*b* . . . and 500*c* is passed through coefficient blocks 908, 916, 924 . . . and 932 to the adder 524. The related coefficient blocks have matching coefficients. Thus, coefficient blocks 904 and 908 have the same coefficient ($k_1$). Coefficient blocks 912 and 916 have the same coefficient ($k_2$). Coefficient blocks 920 and 924 have the same coefficient ($k_{n-1}$), and coefficient blocks 928 and 932 have the same coefficient ($k_n$). Including both "c" and "k" coefficient terms in the feedback tends to improve the stability of the modulator and allows for more aggressive noise shaping and a higher modulation index, while still providing a low sensitivity to coefficient and gain mismatches.

The alternative embodiment of FIG. 9 also differs from the embodiment of FIG. 5A in that additional coefficient blocks ($\sqrt{a/b}$) 902 and ($\sqrt{b/a}$) 936 are included in the input and output imaginary paths. These coefficient blocks allow for the possibility that the resonator 500*a*, 500*b*, . . . 500*c* coefficients a and b are not equal, as was assumed for clarity in the previous discussions. Analysis of the resonator complex transfer function as carried out in relation to FIG. 6 can be repeated out without assuming that the coefficients a and b are equal. When this is done, it is determined that the resonators 500*a*, 500*b*, . . . 500*c* can still achieve an overall linear complex loop filter (H(z)) 300 provided that the ratio a/b is the same for each resonator, and provided that the coefficient blocks ($\sqrt{a/b}$) 902 and ($\sqrt{b/a}$) 936 are added to the modulator. In this case, the location of the noise zero contributed by each resonator 500*a*, 500*b*, . . . 500*c* is given by $f_{zero}=(f_s/p)\sin^{-1}(\sqrt{ab}/2)$. It is noted that further alternative embodiments and configurations using resonator 500 may be implemented.

Figure 10:
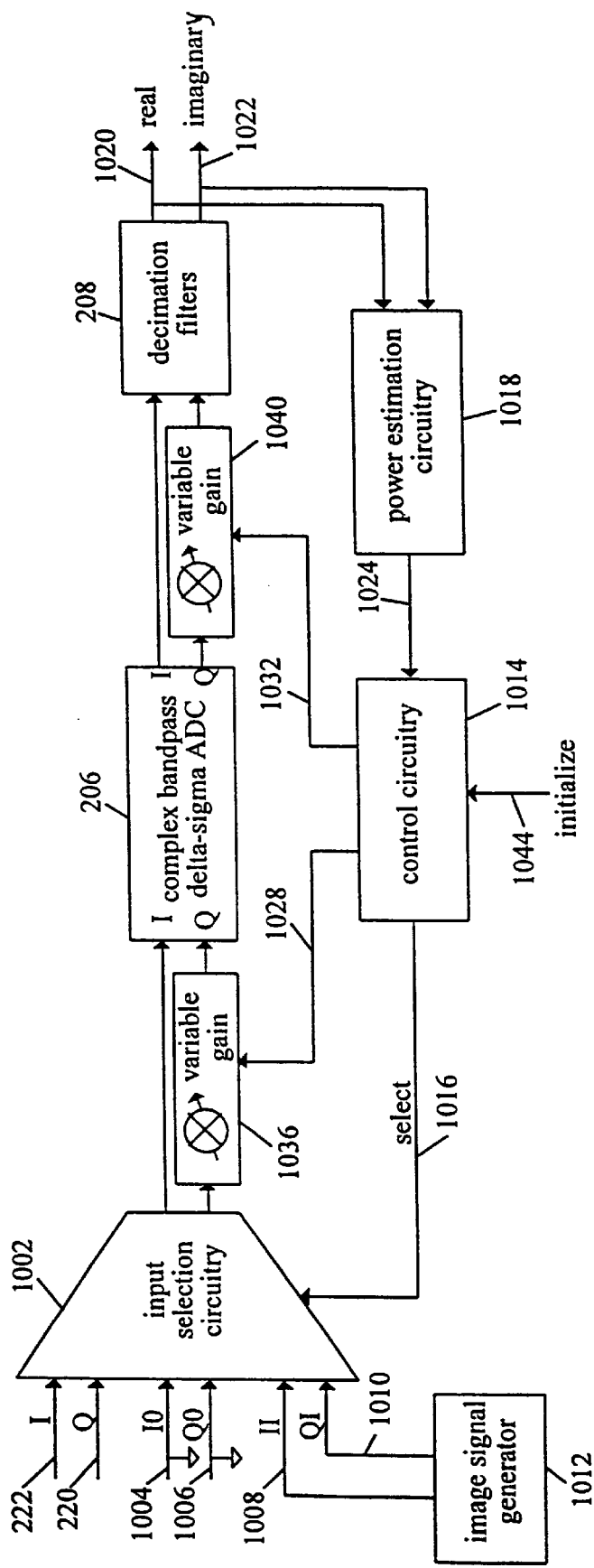
FIG. 10 is a block diagram of an embodiment for a calibration system for the complex bandpass modulator depicted with respect to FIGS. 5A and 9.

FIG. 10 depicts a block diagram for an embodiment of a system which automatically detects and compensates for mismatches in complex bandpass delta-sigma ADC 206 and allows the removal of undesired interference in the output signals. Input selection circuitry 1002 switches the input of ADC 206 between regular input signals (I) 222 and (Q) 220, zero input signals ($O_1$) 1004 and (QO) 1006, and image signal inputs (II) 1008 and (QI) 1010 from the image signal generator 1012. The input select circuitry 1002 is under the control of the control circuitry 1014 according to the setting of the select signal 1016. Power estimation circuitry 1018 receives the real and imaginary output signals 1020 and 1022 from the decimation filters 208 and produces power estimation value 1024 which represents an estimate of the complex signal power contained in decimation filter outputs 1020 and 1022. Control circuitry 1014 receives power estimation signal 1024 and produces gain control signals 1028 and 1032 which respectively control input and output variable gain blocks 1036 and 1040 located in the ADC input and output imaginary paths. The gain of variable gain blocks 1036 and 1040 can be varied within a certain range above and below the nominal value appropriate for ADC 206 with no mismatches. It is also noted that the variable gain blocks 1036 and 1040 allow for adjustment of the relative gain of the real and imaginary paths. Thus, if desired, variable gain blocks would be implemented in the real path as opposed to the imaginary path or could be implemented in both the real and imaginary paths.

Under normal operation, control circuitry 1014 controls input selection circuitry 1002 to select the regular input signals (I) 222 and (Q) 220, and maintains previously determined values for gain control signals 1028 and 1032. In response to initialization signal 1044, which could be triggered by various conditions, for example by power-up or by timer circuitry (not shown) on a periodic basis or by external test or other circuitry, control circuitry 1014 begins mismatch detection and correction by controlling input selection circuitry 1002 to select zero signals (IO) 1004 and (QO) 1006. Control circuitry 1014 then monitors the power estimation signal 1024, and adjusts output variable gain control signal 1032 until the power estimation signal 1024 attains minimum value. This achieves compensation for ADC mismatches which cause quantization noise to be folded into the desired signal frequency range.

Keeping the output variable gain control signal 1032 constant, the control circuitry 1014 then causes input selection circuitry 1002 to select image signal inputs (II) 1008 and (QI) 1010. Control circuitry 1014 then monitors the power estimation signal 1024, and adjusts input variable gain control signal 1028 until the power estimation signal 1024 attains minimum value. This achieves compensation for ADC mismatches that cause image signals to be folded into the desired signal frequency range. Keeping both the input and output variable gain control signals 1028 and 1032 constant, the control circuitry 1014 then returns to normal operation with the input selection circuitry 1002 selecting the regular input (I) 222 and (Q) 220.

What is claimed is:

1. An analog-to-digital converter, comprising:
   real and imaginary input signals;
   a real path quantizer having a real digital output signal;
   an imaginary path quantizer having an imaginary digital output signal; and
   a complex loop filter coupled to receive the real and imaginary input signals and to provide output signals to the real and imaginary path quantizers, said complex loop filter including a plurality of non-linear resonators connected together and acting as a linear complex operator the plurality of non-linear resonators being connected in series so that the output of a previous resonator is coupled to the input of the next resonator:
   wherein a plurality of outputs from the non-linear resonators are combined to provide an output to the real path quantizer: and
   wherein a plurality of outputs from the non-linear resonators are combined to provide an output to the imaginary path quantizer.

2. The analog-to-digital converter of claim 1, further comprising a real path adder coupled to subtract a real path feedback signal from the real input signal and an imaginary path adder coupled to subtract an imaginary path feedback signal from the imaginary input signal.

3. The analog-to-digital converter of claim 2, wherein the real feedback signal comprises the real digital output signal passed through a real path digital-to-analog converter and the imaginary feedback signal comprises the imaginary digital output signal passed through an imaginary digital-to-analog converter.

4. The analog-to-digital converter of claim 2, further comprising an input delay block coupled to delay the imaginary input signal by half a sample interval relative to the real input signal before the imaginary input signal is received by the complex loop filter and an output advance block coupled to advance the imaginary digital output signal by half a sample interval relative to the real digital output signal.

5. A complex loop filter for an analog-to-digital converter, comprising:
   a plurality of non-linear resonators coupled to a real input signal and an imaginary input signal to provide an unquantized real output signal and an unquantized imaginary output signal;

wherein the plurality of non-linear resonators are connected together to act as a linear complex operator, the plurality of non-linear resonators being connected in series so that the output of a previous resonator is coupled to the input of the next resonator;

wherein a plurality of outputs from the non-linear resonators are combined to provide the unquantized real output signal to be digitized; and wherein a plurality of outputs from the non-linear resonators are combined to provide the unquantized imaginary output signal to be digitized.

6. The complex loop filter of claim 5, further comprising a real path adder and an imaginary path adder, the real path adder receiving a first output signal from each of the non-linear resonators and the imaginary path adder receiving a second output signal from each of the non-linear resonators.

7. The complex loop filter of claim 6, wherein the first and second output signals from each resonator are weighted by an equivalent coefficient.

8. The complex loop filter of claim 5, wherein a noise shaping profile achieved is symmetrical around a half sampling frequency such that there is one noise zero located at a desired center frequency below the half sampling frequency.

9. The complex loop filter of claim 6, wherein the real path adder further receives a third output signal from each of the non-linear resonators and the imaginary path adder receiving a fourth output signal from each of the non-linear resonators.

10. The complex loop filter of claim 9, wherein the first and second output signals from each resonator are weighted by an equivalent coefficient and the third and fourth output signals from each resonator are weighted by an equivalent coefficient.

11. A resonator for a modulator within an analog-to-digital converter, comprising:

a real signal path including a first input and first output signals; and an imaginary signal path including a second input and second output signals;

wherein said resonator acts as a linear complex operator when the second input signal is delayed by half a sample interval and the second output signal is advanced by half a sample interval; and wherein the resonators are configured to be connected in series so that the output of a previous resonator is coupled to the input of the next resonator.

12. The resonator of claim 11, wherein the imaginary signal path further comprises a third output signal.

13. The resonator of claim 11, further comprising a first integrator coupled between the first input signal and the second output signal and a second integrator coupled between the second input signal and the first output signal.

14. The resonator of claim 11, wherein a relationship between the first input signal ($I_1$), the second input signal ($I_2$), the first output signal ($O_1$) and the second output signal ($O_2$) is represented by:

$$\begin{pmatrix} O_1 \\ O_2 \end{pmatrix} = \frac{1}{z^2 + z(ab-2) + 1} \begin{pmatrix} -zab & zb(1-z) \\ -a(1-z) & -zab \end{pmatrix} \begin{pmatrix} I_1 \\ I_2 \end{pmatrix}$$

wherein a and b represent coefficients from coefficient blocks within the resonator.

15. The resonator of claim 11, wherein the resonator is a switched-capacitor implementation.

16. An analog-to-digital converter system, comprising:

an analog-to-digital converter coupled to receive real and imaginary input signals and to provide real and imaginary digital output signals;

variable gain circuitry coupled to the analog-to-digital converter the variable gain circuitry comprising input Rain circuitry coupled to the input of the analog-to-digital converter and output gain circuitry coupled to the output of the analog-to-digital converter, and control circuitry having control signals as an outputs, the control signals being coupled to the variable gain circuitry and acting to adjust the input gain circuitry and the output gain circuitry;

wherein the control circuitry is operable to adjust the control signals to compensate for undesired interference in the output signals from the analog-to-digital converter.

17. The analog-to-digital converter system of claim 16, further comprising input selection circuitry coupled to provide the real and imaginary input signals to the analog-to-digital converter, the input selection circuitry receiving and selecting between multiple sets of signals, and wherein the control circuitry has a selection control signal that is coupled to the input selection circuitry to determine which of the multiple sets of signals are selected by the input selection circuitry.

18. The analog-to-digital converter system of claim 17, wherein the variable gain circuitry comprises output gain circuitry coupled to the imaginary digital output signal to provide a gain adjusted imaginary digital output signal from the analog-to-digital converter and wherein the variable gain circuitry comprises input gain circuitry coupled to the imaginary input signal to provide a Rain adjusted imaginary input signal to the analog-to-digital converter.

19. The analog-to-digital converter system of claim 18, wherein the multiple sets of signals comprises a first set of signals including a real signal and an imaginary signal and a second set of signals including a zero level real signal and a zero level imaginary signal.

20. The analog-to-digital converter of claim 19, wherein the control signal is adjustable to reduce a level of interference in the output signals from the analog-to-digital converter while the selection control signal is asserted to select the zero level real and imaginary signals.

21. The analog-to-digital converter of claim 20, wherein the interference is caused by mismatches within the analog-to-digital converter that folded quantization noise into the desired signal frequency range.

22. The analog-to-digital converter system of claim 16, wherein the analog-to-digital converter comprises:

a real path quantizer having a real digital output signal;

an imaginary path quantizer having an imaginary digital output signal; and a complex loop filter coupled to receive the real and imaginary input signals and to provide output signals to the real and imaginary path quantizers, said complex loop filter including a plurality of non-linear resonators connected together and acting as a linear complex operator, the plurality of non-linear resonators being connected in series so that the output of a previous resonator is coupled to the input of the next resonator;

wherein a plurality of outputs from the non-linear resonators are combined to provide an output to the real path quantizer; and wherein a plurality of outputs form the non-linear resonators are combined to provide an output to the imaginary path quantizer.

23. The analog-to-digital converter system of claim 22, further comprising an input delay block coupled to delay the imaginary input signal by half a sample interval relative to the real input signal before the imaginary input signal is received by the complex loop filter and an output advance block coupled to advance the imaginary digital output signal by half a sample interval relative to the real digital output signal.

24. An analog-to-digital converter system, comprising:
an analog-to-digital converter coupled to receive real and imaginary input signals and to provide real and imaginary digital output signals;
variable gain circuitry coupled to the analog-to-digital converter;
control circuitry having a control signal as an output the control signal being coupled to the variable gain circuitry; and
input selection circuitry coupled to provide the real and imaginary input signals to the analog-to-digital converter, the input selection circuitry receiving and selecting between multiple sets of signals, and wherein the control circuitry has a selection control signal that is coupled to the input selection circuitry to determine which of the multiple sets of signals are selected by the input selection circuitry;
wherein the control circuitry is operable to adjust the control signal to compensate for undesired interference in the output signals from the analog-to-digital converter.

25. The analog-to-digital converter system of claim 24, further comprising power estimation circuitry coupled to the output signals from the analog-to-digital converter and having a power estimation signal as an output, the power estimation signal being provided to the control circuitry and the control signal being dependent upon the power estimation signal.

26. The analog-to-digital converter system of claim 24, wherein the variable gain circuitry comprises circuitry coupled to the imaginary input signal to provide a gain adjusted imaginary input signal to the analog-to-digital converter.

27. The analog-to-digital converter system of claim 26, further comprising second variable gain circuitry coupled to the imaginary digital output signal to provide a gain adjusted imaginary digital output signal from the analog-to-digital converter, and wherein the control circuitry has a second control signal as an output that is coupled to the second variable gain circuitry, the control circuitry being also operable to adjust the second control signal to compensate for undesired interference in the output signals from the analog-to-digital converter.

28. The analog-to-digital converter system of claim 24, wherein the multiple sets of signals comprises a first set of signals including a real signal and an imaginary signal and a second set of signals including a real image signal and an imaginary image signal.

29. The analog-to-digital converter of claim 28, wherein the control signal is adjustable to reduce a level of interference in the output signals from the analog-to-digital converter while the selection control is asserted to select the real and imaginary image signals.

30. The analog-to-digital converter of claim 29, wherein the interference is caused by mismatches within the analog-to-digital converter that have folded the image signals into the desired signal frequency range.

31. A method for modulating real and imaginary input signals within an analog-to-digital converter, comprising:

connecting together a plurality of non-linear resonators to act as a linear complex operator for a complex bandpass loop filter for an analog-to-digital converter; the plurality of non-linear resonators being connected in series so that the output of a previous resonator is coupled to the input of the next resonator;
utilizing a plurality of outputs from the non-linear resonators to provide an output to a real path quantizer and a plurality of outputs from the non-linear resonators to provide an output to an imaginary path quantizer; and
filtering real and imaginary input signals with the complex bandpass loop filter.

32. The method of claim 31, further comprising quantizing the filtered real and imaginary input signals with a real path quantizer and an imaginary path quantizer to produce real and imaginary digital output signals.

33. The method of claim 32, further comprising generating a real path feedback signal by passing real digital output signal through a real path digital-to-analog converter and generating an imaginary feedback signal by passing the imaginary digital output signal through an imaginary digital-to-analog converter.

34. The method of claim 33, farther comprising utilizing a real path adder to subtract the real path feedback signal from the real input signal and utilizing an imaginary path adder to subtract the imaginary feedback signal from the imaginary input signal.

35. The method of claim 32, wherein the providing step further comprises delaying the imaginary input signal by half a sample interval before the imaginary input signal is received by the complex bandpass modulator and advancing the imaginary digital output signal by half a sample interval.

36. The method of claim 31, wherein the producing step further comprises adding together a first output signal from each of the non-linear resonators to obtain the modulated real output signal and adding together a second output signal from each of the non-linear resonators to obtain the modulated imaginary output signal.

37. The method of claim 36, wherein the producing step further comprises weighting the first and second output signals from each resonator by an equivalent coefficient.

38. A method for modulating real and imaginary input signals within an analog-to-digital converter system, comprising:
receiving a real input signal and an imaginary input signal during a normal mode of operation;
receiving a zero level real input signal and a zero level imaginary input signal during an interference compensation mode of operation;
converting the input signals into a real digital output signal and an imaginary digital output signal with an analog-to-digital converter in both the normal and compensation modes of operation;
selecting to receive the real and imaginary input signals when in the normal mode of operation and the zero level real and imaginary input signals when in the interference compensation mode of operation; and
during the compensation mode of operation, adjusting the gain of the imaginary digital output signal to compensate for undesired interference in the output signals from the analog-to-digital converter.

39. The method of claim 38, wherein the interference is caused by mismatches within the analog-to-digital converter that folded quantization noise into the desired signal frequency range.

40. The method of claim 38, further comprising receiving a real input image signal and an imaginary input image signal and adjusting the gain of the imaginary input signal to compensate for undesired interference in the output signals from the analog-to-digital converter during the compensation mode of operation.

41. The method of claim 40, wherein the zero level real and imaginary input signals are received and the imaginary digital output signal is adjusted before the real and imaginary input image signals are received and the imaginary input signal is adjusted.

42. The method of claim 38, wherein the converting step comprises connecting together a plurality of non-linear resonators to act as a linear complex operator for a complex bandpass loop filter for an analog-to-digital converter the resonators being connected in series so that the output of a previous resonator is coupled to the input of the next resonator.

43. A method for modulating real and imaginary input signals within an analog-to-digital converter system, comprising:

receiving a real input signal and an imaginary input signal during a normal mode of operation;

receiving a real input image signal and an imaginary input image signal during a compensation mode of operation;

converting the input signals into a real digital output signal and an imaginary digital output signal with an analog-to-digital converter in both the normal and compensation modes of operation;

selecting to receive the real and imaginary input signals when in the normal mode of operation and the real and imaginary input image signals when in the interference compensation mode of operation; and during the compensation mode of operation, adjusting the gain of the imaginary input signal to compensate for undesired interference in the output signals from the analog-to-digital converter.

44. The method of claim 43, wherein the interference is caused by mismatches within the analog-to-digital converter that have folded the image signals into the desired signal frequency range.

45. The method of claim 44, wherein the converting step comprises connecting together a plurality of non-linear resonators to act as a linear complex operator for a complex bandpass loop filter for an analog-to-digital converter, the resonators being connected in series so that the output of a previous resonator is coupled to the input of the next resonator.

* * * * *